(12) United States Patent
Murakami et al.

(10) Patent No.: US 6,196,877 B1
(45) Date of Patent: Mar. 6, 2001

(54) ELECTRICAL CONNECTION BOX

(75) Inventors: Masakazu Murakami, Hikone; Masami Tanabe, Sakata-gun, both of (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/393,741

(22) Filed: Sep. 10, 1999

(30) Foreign Application Priority Data

Sep. 30, 1998 (JP) ................................................. 10-278658
Oct. 6, 1998 (JP) ................................................. 10-284424

(51) Int. Cl.⁷ .................................................. H01R 25/00
(52) U.S. Cl. ............................................. 439/638; 439/408
(58) Field of Search ..................... 439/76.2, 949, 439/212, 407, 408, 456, 638

(56) References Cited

U.S. PATENT DOCUMENTS

| | | | |
|---|---|---|---|
| 5,023,752 | * 6/1991 | Detter et al. | 439/76.2 |
| 5,207,587 | * 5/1993 | Hamill et al. | 439/76.2 |
| 5,920,034 | * 7/1999 | Saka et al. | 439/76.2 |
| 5,934,929 | * 8/1999 | Saka et al. | 439/408 |
| 5,980,302 | * 8/1999 | Saka | 439/76.2 |

* cited by examiner

Primary Examiner—T. C. Patel
(74) Attorney, Agent, or Firm—Frishauf, Holtz, Goodman, Langer & Chick, P.C.

(57) ABSTRACT

An electrical connection box comprises lower and upper casings capable of being combined with each other, an electrically insulating wiring board located between the casings and having a wire laid in a desired shape thereon, a busbar in contact with at least a part of a wire laying surface of the wiring board, and an insulating plate located between the lower casing and the wiring board and/or between the upper casing and the wiring board. The insulating plate has thereon a projection for pressing the laid wire away from the busbar. The wiring board is formed with a laying groove in which the wire is laid. Post-formed protuberances for preventing the wire from getting out of the laying groove are formed in predetermined portions of the laying groove.

6 Claims, 9 Drawing Sheets

ELECTRICAL CONNECTION BOX

BACKGROUND OF THE INVENTION

1. Field of the Invention

The present invention relates to an electrical connection box, and more specifically, to an electrical connection box mounted in an automobile or the like and loaded with electrical components.

2. Description of the Related Art

As vehicles, e.g., automobiles, are expected to meet increasing market requirements for comfortable riding, they tend to require use of increased built-in electric devices, such as an audio system, navigation system, TV set, power antenna, air conditioner, rear window heater, seat heater, power seat, suspension hardness control device, etc.

The built-in electric devices are supplied with electric power from a battery in an engine room through an electrical connection box near the battery and a wire harness. In some cases, excessive current may flow in the electrical connection box if the vehicle body and the wire harness or the like are shorted or if a load such as a motor goes wrong from any cause. The electrical connection box is mounted with electrical components, such as fuses to cope with such trouble and relays that control power supply to the built-in electric devices in association with various operating switches.

The electrical connection box comprises lower and upper casings capable of being combined with each other, an electrically insulating wiring board located between the lower and upper casings and having wires laid in a desired shape on either side thereof, pressure-welded terminals for lectrical connection between the wires and electrical components and connection between the wires, busbars for high-current conduction on either side of the wiring board, an insulating plate interposed between the upper casing and the busbars so that one of the busbars is held between the insulating plate and the wiring board, and the like. The lower and upper casings are fitted with electrical components, such as relays, fuses, external connecting terminals to be connected to the body-side wire harness, etc., which are located individually in given positions.

Figure 14:
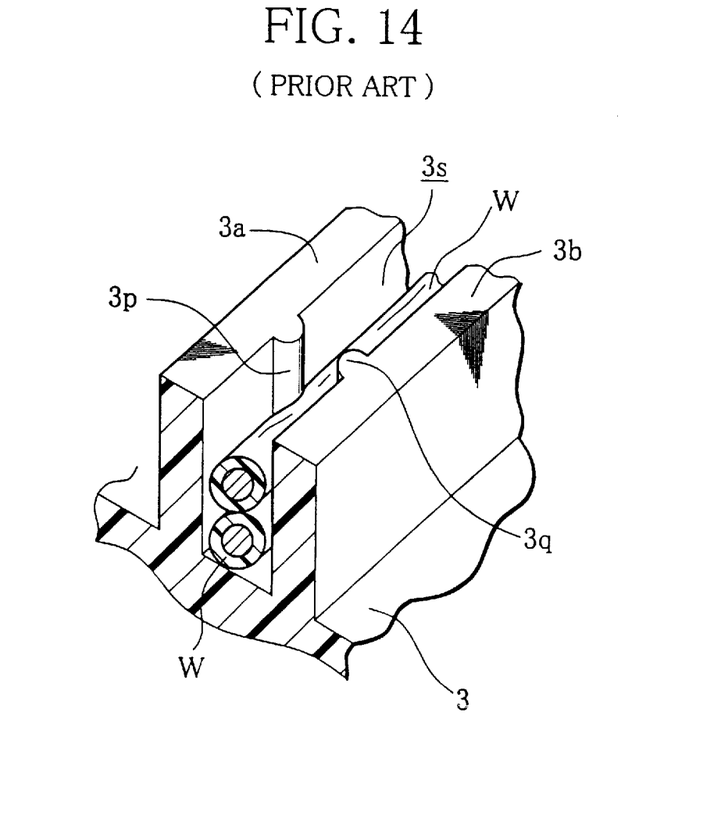
FIG. 14 is a partial perspective view, partially in section, showing wire holding projections 3p and 3q formed on ribs 3a and 3b of the conventional electrical connection box.

In order to form a laying groove 3s in which a wire W is laid in a desired shape, the wiring board is formed with ribs 3a and 3b that extend lengthwise and crosswise and are opposed to each other with a given space between them, as shown in the partial perspective view of FIG. 14. Besides, the respective inner walls of the ribs 3a and 3b are formed individually with projections 3p and 3q that are arranged at given spaces and opposed to one another, whereby the wire W is held and prevented from slipping out of the groove 3s. The wire W is continuously inserted into the laying groove 3s to be laid along a predetermined path on the wiring board.

In general, the wire laying operation is carried out by means of an automatic laying apparatus (not shown). More specifically, the leader of the wire W is inserted into a given position in the laying groove 3s by means of the laying apparatus. Subsequently, the wire W is continuously laid with one stroke along the predetermined path, and its trailer is cut. Thereafter, the laid wire is cut at given spots to be divided into sections for desired circuits, and pressure-welded terminals are driven in given positions so that the wire is connected electrically to the electrical components and external connecting terminals for the individual circuits. Further, busbars each having a given shape are attached to wire laying surfaces of the wiring board 3. The busbars serve to distribute high current from the battery or an alternator. The distributed current is supplied to actuators through the laid wire, fuses, relays, etc.

Each busbar is formed of an electrically conductive metal plate. One busbar is attached to the underside of the lower casing that faces a laying surface of the wiring board, while another busbar is attached to one side of the insulating plate. When the electrical connection box is assembled, each busbar is in contact with a predetermined portion of its corresponding laying surface of the wiring board.

Figure 12:
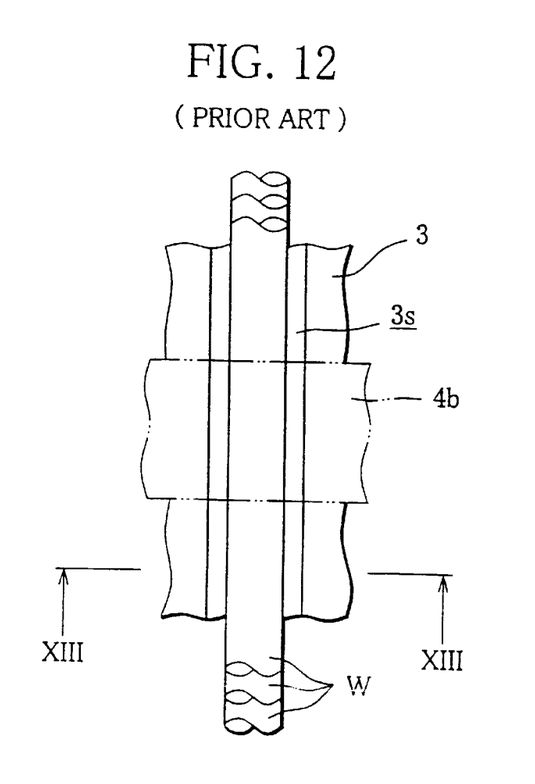
FIG. 12 is a view partially showing a wire W laid in a laying groove 3s of a wiring board 3 of a conventional electrical connection box.
Figure 13:
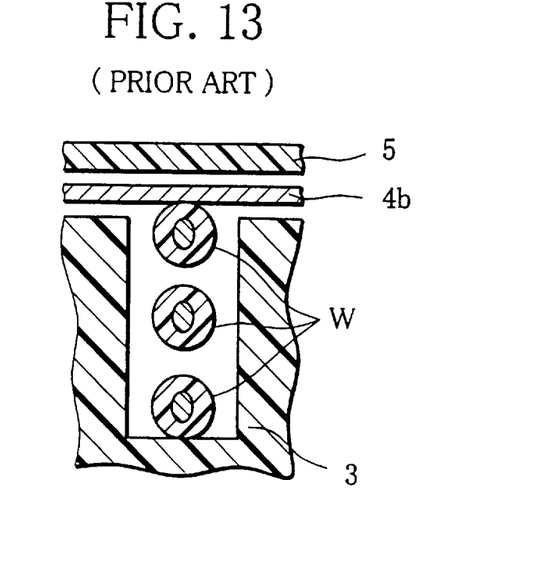
FIG. 13 is a sectional view taken along line XIII—XIII of FIG. 12, showing a busbar 4b and an insulating plate 5 attached to each other.

The wire is laid with one stroke, as mentioned before, and is cut in given positions so that a large number of independent circuits are formed. In specific positions in the laying groove 3s, therefore, the wire is laid in two or three tiers. In some cases, the top line of the wire may be lifted by its own deflection or by deflection of the underlying line or lines so that it projects above the laying surface of the wiring board. More specifically, if the wire W is laid in tiers in the laying groove 3s, as shown in FIG. 12, its top line often touches a busbar 4b, as shown in FIG. 13. If the electrical connection box assembled with the wire W in contact with the busbar 4b is mounted in a vehicle, the wire W and the busbar 4b are caused to rub against each other by prolonged vibration of the vehicle, so that an insulator-coated portion of the wire W may possibly break and cause a short circuit. This breakage easily occurs in those portions of the wire W which are in contact with the edges of the busbar 4b, in particular.

In general, the wiring board 3 is a molded article formed of a resin material, such as polypropylene, so that its dimensions are subject to dispersion. In some cases, therefore, the width of the laying groove 3s on the wiring board shown in FIG. 14 and the distance between the opposed wire holding projections 3p and 3q are also subject to dispersion. If the distance between the projections 3p and 3q is shorter than a predetermined length, the wire W cannot be fully inserted into the space between the projections 3p and 3q. Therefore, the wire W may be lifted out of the laying groove 3s as it is laid. If the distance between the projections 3p and 3q is longer than the predetermined length, on the other hand, the wire W may be caused to slip out of the groove 3s by vibration or the like without being held between the projections 3p and 3q. In spots where the wire W is laid in tiers, in particular, the wire W is liable to project from the laying groove 3s.

Figure 15:
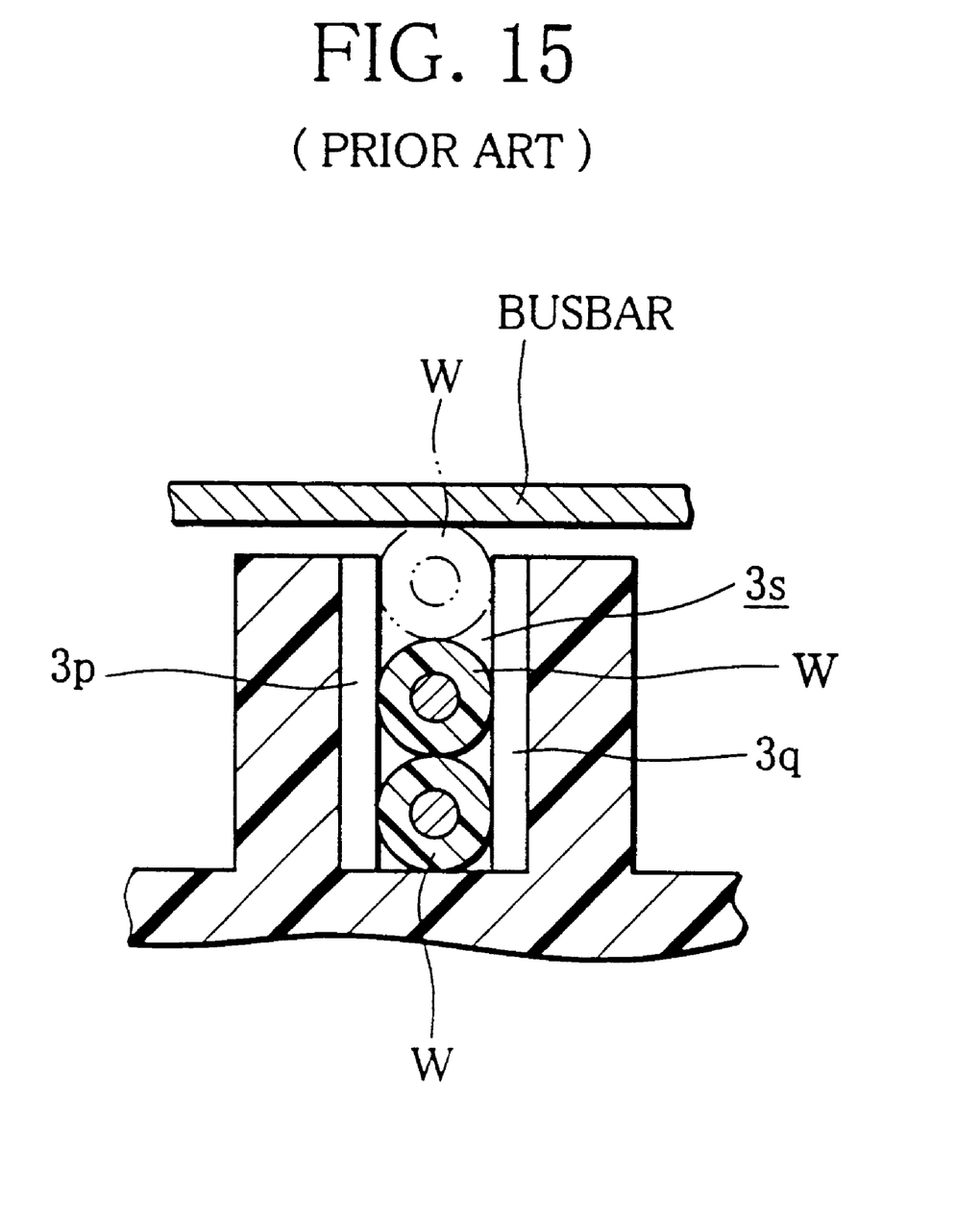
FIG. 15 is a sectional view partially showing the wire W laid in the laying groove 3s of the conventional electrical connection box.

If the busbar, lower casing, upper casing, etc. are attached to one another with the wire W projecting from the laying groove 3s, that portion of the wire W which projects from the groove 3s keeps on interfering with the busbar, as indicated by two-dot chain lines in FIG. 15.

Since the wiring board and the busbar are interposed between the upper and lower casings, the above awkward situation cannot be easily detected once the electrical connection box is assembled.

If the electrical connection box in this state is mounted directly in the vehicle, the wire W and the busbar are caused to rub against each other by the vehicle's vibration, so that the insulator-coated portion of the wire W may possibly break and cause an undesirable short circuit between the busbar and the wire.

SUMMARY OF THE INVENTION

An object of the present invention is to provide an electrical connection box in which a wire is prevented from slipping out of a laying groove of a wiring board.

Another object of the invention is to provide an electrical connection box in which a wire can be securely laid on a wiring board without the possibility of its being caused to rub against a busbar and breaking its coated portion.

Still another object of the invention is to provide an electrical connection box in which a wire can be securely laid on a wiring board without the possibility of its slipping out of a laying groove despite dispersion in dimensions of the wiring board.

In order to achieve the above objects, an electrical connection box according to the present invention for carrying electrical components comprises first and second casings capable of being combined with each other, an electrically insulating wiring board located between the casings and having a wire laid in a desired shape thereon, a busbar in contact with a predetermined portion of a wire laying surface of the wiring board, and an insulating plate located between the first casing and the wiring board and/or between the second casing and the wiring board. The insulating plate has thereon a projection for pressing the laid wire away from the busbar.

In assembling the electrical connection box constructed in this manner, the projection of the insulating plate presses the wire near the busbar away from the busbar. When the electrical connection box is assembled, therefore, the laid wire can be prevented from touching the busbar. In consequence, the busbar and the wire cannot be caused to rub against each other by prolonged vibration, so that there is no possibility of an insulator-coated portion of the wire breaking and causing a short circuit. Since the wire can be securely separated from the busbar at the edge portions thereof, in particular, it can be effectively prevented from breaking.

In order to achieve the above objects, moreover, an electrical connection box according to the present invention for carrying electrical components comprises first and second casings capable of being combined with each other and an electrically insulating wiring board located between the casings and having a wire laid in a desired shape thereon. The first casing and/or the second casing has, on that surface thereof which is in contact with a wire laying surface of the wiring board, a projection for pressing the laid wire away from the busbar.

In assembling the electrical connection box constructed in this manner, the projection of the first casing and/or the second casing presses the wire near the busbar away from the busbar. When the electrical connection box is assembled, therefore, the laid wire can be prevented from touching the busbar. In consequence, as mentioned before, the busbar and the wire cannot be caused to rub against each other by prolonged vibration, so that there is no possibility of the insulator-coated portion of the wire breaking and causing a short circuit.

Preferably, the wiring board is formed with a laying groove in which the wire is laid.

According to this preferred arrangement, the projection on the insulating plate or the first casing and/or the second casing never fails to push the wire into the laying groove, so that the laid wire can be securely prevented from touching the busbar.

Preferably, moreover, the busbar has a notch or hole in a predetermined portion thereof, and the projection is formed on that portion of the insulating plate which corresponds to the notch or hole.

According to this preferred arrangement, the projection formed on that portion of the insulating plate which corresponds to the notch or hole can securely push the wire near the busbar into the laying groove even if the busbar is wide.

In order to achieve the above objects, furthermore, an electrical connection box according to the present invention for carrying electrical components comprises first and second casings capable of being combined with each other and an electrically insulating wiring board located between the casings and formed with a laying groove in which a wire is laid in a desired shape. The laying groove has, in a predetermined portion thereof, at least one post-formed protuberance for preventing the wire from getting out of the laying groove.

Since the wire retaining protuberance is formed in the laying groove after the wire is laid in the groove, the wire laying operation can be carried out smoothly. Further, the wire can be prevented from slipping out of the laying groove of the wiring board despite dispersion in dimensions of the laying groove.

BRIEF DESCRIPTION OF THE DRAWINGS

The above and other objects, features, and advantages of the invention will be more apparent from the ensuing detailed description taken in connection with the accompanying drawings, in which.

DETAILED DESCRIPTION OF THE PREFERRED EMBODIMENTS

The present invention will now be described in detail with reference to the accompanying drawings.

Figure 1:
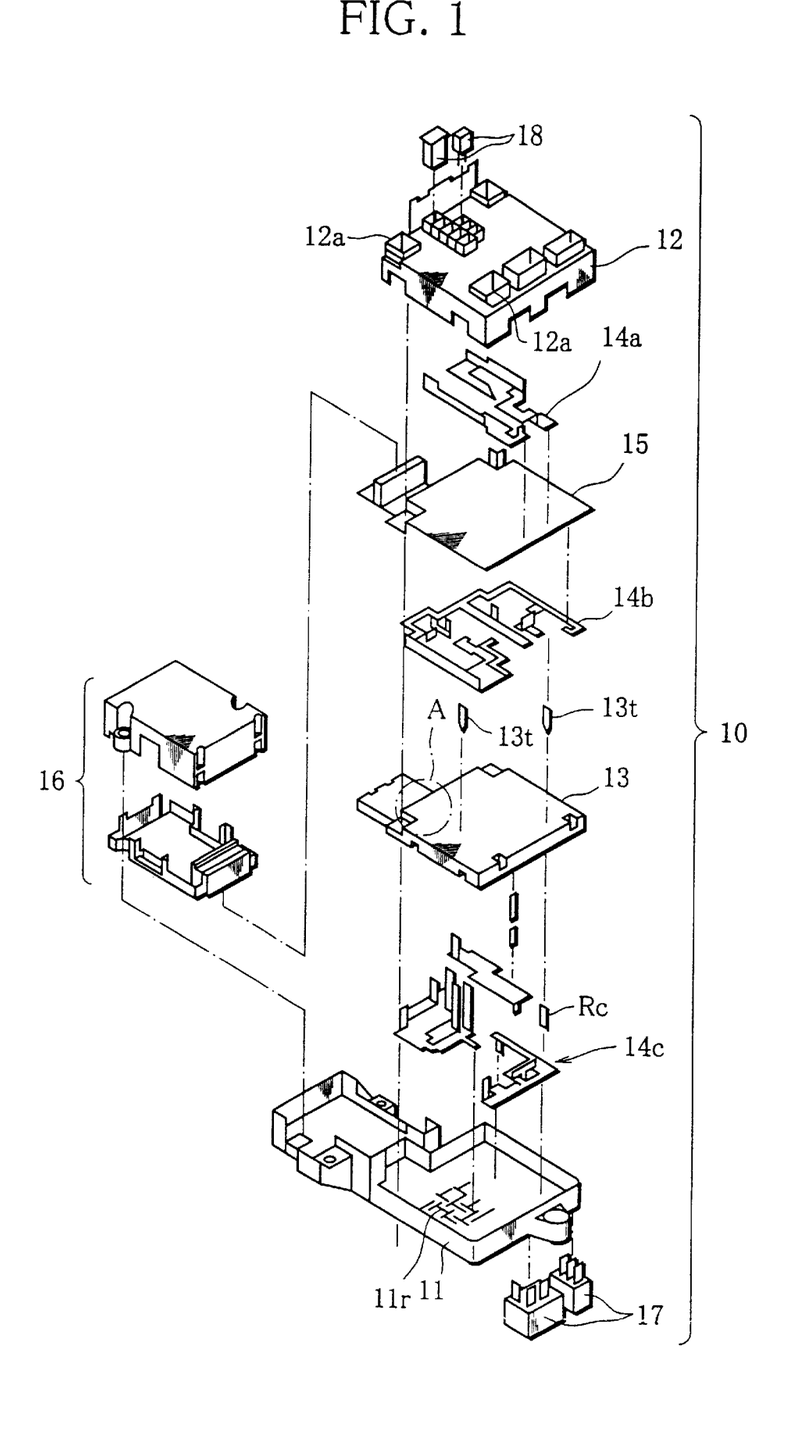
FIG. 1 is an exploded perspective view of an electrical connection box 10 according to one embodiment of the invention.

As shown in the exploded perspective view of FIG. 1, an electrical connection box 10 according to one embodiment of the invention comprises a lower casing 11 fitted with relays 17, an upper casing 12 fitted with fuses 18 and formed with external connecting terminals 12a for connection with a wire harness, and an electrically insulating wiring board 13 located between the lower and upper casings 11 and 12 and having a wire W (shown in FIG. 2 only) for low-current conduction thereon. The electrical connection box 10 further comprises busbars 14a, 14b and 14c interposed between the wiring board 13 and the upper casing 12 and between the wiring board 13 and the lower casing 11 and serving to conduct high current, an insulating plate 15 put on the wiring board 13 so that the busbar 14b is held between the plate 15 and the wiring board 13, an electronic unit 16 attached to the lower casing 11, etc.

Figure 2:
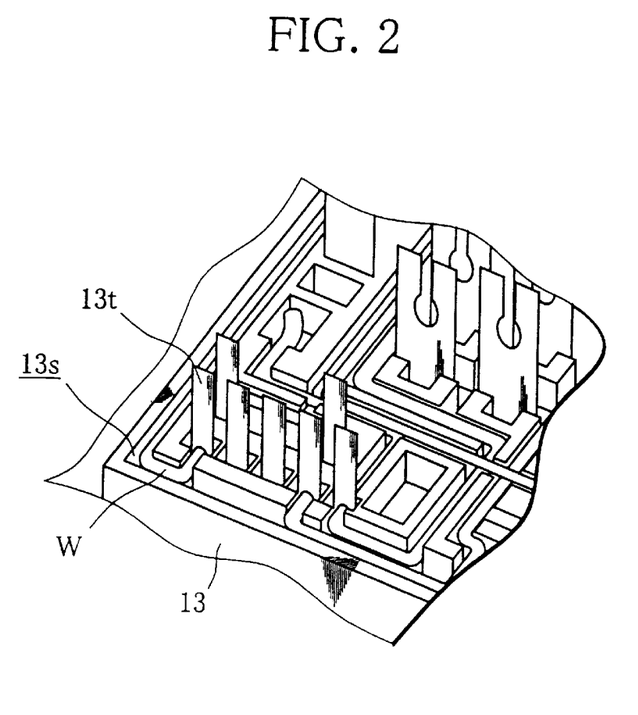
FIG. 2 is a detailed perspective view showing a part (portion A in FIG. 1) of a wiring board 13 of the electrical connection box 10 shown in FIG. 1.

As shown in FIG. 2, a laying groove 13s, which is a little wider than the wire W, is formed on each of two opposite sides (upper and lower surfaces in FIG. 2) of the wiring board 13. On each surface of the wiring board 13, the wire W is arranged with one stroke along a predetermined path of the laying groove 13s.

In order to form a plurality of independent circuits, the wire W is cut at given spots, and a plurality of pressure-welded terminals 13t are driven in given positions on the wire W. As shown in FIG. 1, the terminals 13t are connected electrically to electrical components, such as the relays 17, fuses 18, external connecting terminals 12a, etc., through a receptacle Rc.

Figure 3:
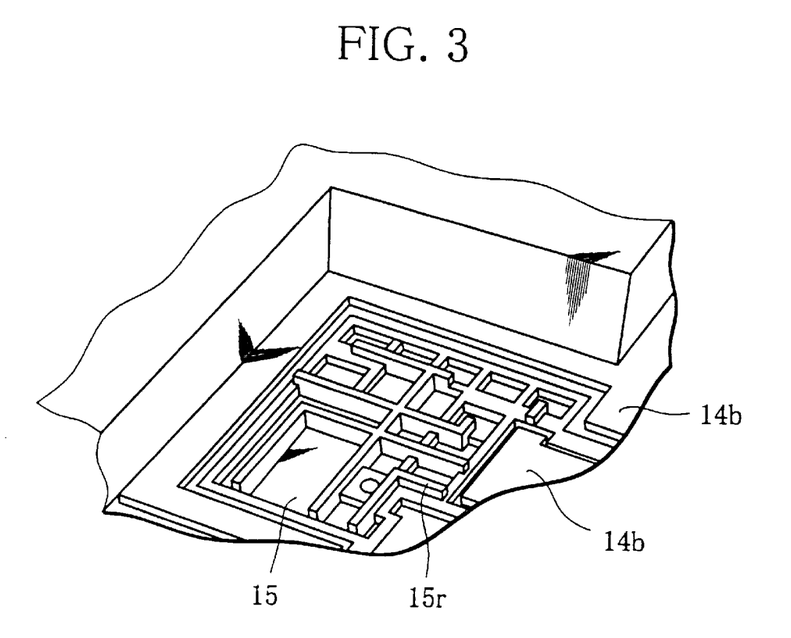
FIG. 3 is a view partially showing that surface of an insulating plate 15 on the wiring board 13 of FIG. 2 which is formed with a rib 15r.

The insulating plate 15 is put on one laying surface (upper surface in FIG. 1) of the wiring board 13. The busbar 14b, which is partially shown in FIG. 3, is located in a given position on the insulating plate 15 so as to be in contact therewith. As seen from FIG. 3, moreover, a rib (projection) 15r is formed on any other region of the insulating plate 15 than that portion which carries the busbar 14b thereon. The rib 15r corresponds in position to the laying groove 13s on that side of the wiring board 13 which is fitted with the insulating plate 15. The rib 15r is high enough to be pressed against the wire W in the laying groove 13s to keep the wire W as apart from the busbar 14b as possible when the insulating plate 15 is mounted on the wiring board 13. Thus, as seen from FIG. 3, the rib 15r projects longer than the busbar 14b on the insulating plate 15. Further, the insulating plate 15 is bored with through holes (not shown) through which the pressure-welded terminals 13t in the wiring board 13 are passed.

The busbars 14c are mounted on that laying surface of the wiring board 13 which faces the lower casing 11. On the other hand, the lower casing 11, like the insulating plate 15, is formed with a pressure rib 11r (only part of which is schematically shown in FIG. 1) on its underside. The rib 11r, like the rib 15r, is formed corresponding to any other region of the laying surface of the wiring board 13 than those portions which engage the busbars 14c, individually. The pressure rib 11r, like the rib 15r, is high enough to press the wire W into the laying groove 13s to keep the laid wire W apart from the busbars 14c when the wiring board 13, along with the busbars 14c, are attached to the lower casing 11.

The functions of the pressure ribs 11r and 15r will now be described in detail for the case of attaching the busbar 14b and the insulating plate 15 to the wiring board 13.

Figure 4:
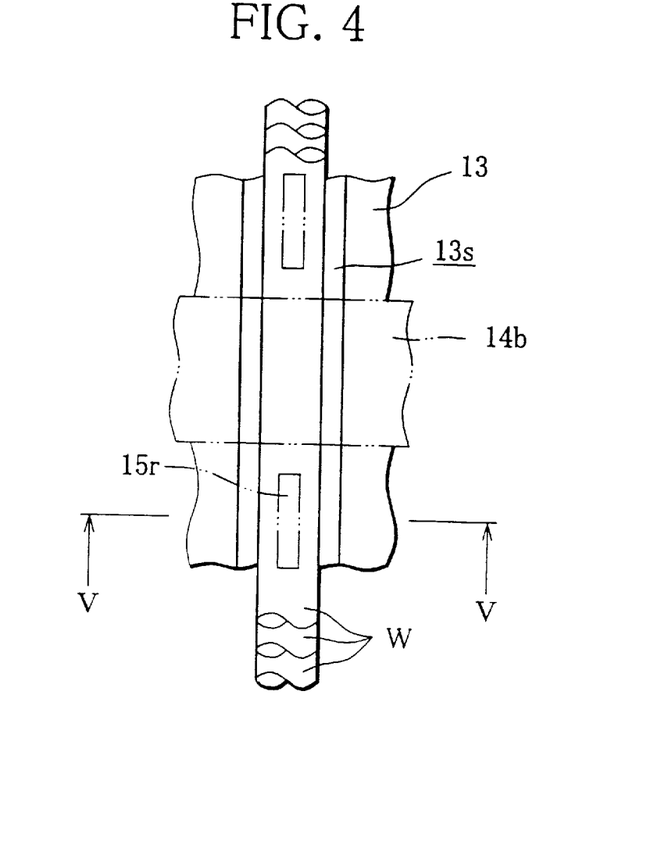
FIG. 4 is a view partially showing a wire W laid in a laying groove 13s of the wiring board 13.
Figure 5:
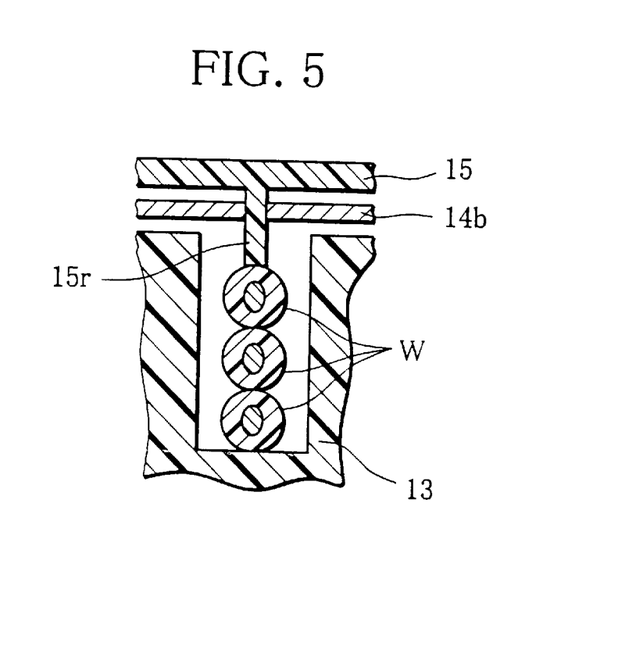
FIG. 5 is a sectional view taken along line V—V of FIG. 4, showing a busbar 14b and the insulating plate 15 attached to each other.

As shown in FIG. 4, the wire W is laid in each laying groove 13s of the wiring board 13. The wire W, which is arranged with one stroke, is trebled in some positions in the laying groove 13s, for example, as shown in FIG. 5. In those portions where the wire W is crossed or folded, as in the prior art case shown in FIG. 13, the top line of the wire W projects outward from the top of the laying groove 13s immediately after the wire W is laid. In the case of the conventional electrical connection box shown in FIG. 13, the busbar 4b is inevitably brought into full contact with the wire W when the busbar 4b and the insulating plate 5 are attached to the laying surface of the wiring board 3. In the case of the electrical connection box 10 according to the present embodiment, however, the pressure rib 15r of the insulating plate 15 pushes the top line of the wire W into the laying groove 13s, as shown in FIG. 5. Thereupon, the wire W that is laid corresponding to the busbar 14b is entrapped into the laying groove 13s, so that it moves away from the busbar 14b. Since those portions of the wire W which are situated near the opposite edge portions of the busbar 14b can be securely kept apart from the busbar 14b, in particular, the wire W can avoid touching the sharp edges of the busbar 14b.

In the case where the wiring board 13 and the busbars 14c are attached to the lower casing 11, as in the case described above, the wire W that is laid on the wiring board 13 during the attachment is pushed into the laying groove 13s of the board 13 by the rib 11r on the underside of the lower casing 11. Accordingly, the wire W that is laid corresponding to the busbars 14c is entrapped into the laying groove 13s and moves away from the busbars 14c. In particular, those portions of the wire W which are situated near the opposite edge portions of the busbars 14c separate from the edge portions of the busbars 14c.

After the wiring board 13, busbars 14b and 14c, insulating plate 15, and lower casing 11 are attached to one another with the wire W off the busbars 14b and 14c in this manner, the busbar 14a, upper casing 12, relays 17, fuses 18, electronic unit 16, etc. are joined together to complete the electrical connection box 10.

If the vehicle mounted with the electrical connection box 10 assembled in this manner is used for a long period of time, the wire W, unlike the one in the conventional electrical connection box shown in FIG. 13, cannot be brought intimately into contact with the busbar 14b. Accordingly, the wire W cannot be caused to rub against the busbars 14b and 14c by the vehicle's vibration, so that there is no possibility of its insulator-coated portion breaking and causing a short circuit. This effect is substantial because the wire W can be securely kept apart from the edge portions of the busbars 14b and 14c that easily break the coated portion of the wire W, in particular.

In the case where a wide busbar is attached to the laying surface of the wiring board, the central portion of the busbar in its width direction and the wire W sometimes may be kept in contact with each other if the wire W around the busbar is pressed by means of a pressure rib. However, the electrical connection box according to the present embodiment, unlike the conventional electrical connection box, is designed so that the wire can be securely kept off the edge portions of the busbar even in the case where the wide busbar is attached to the laying surface of the wiring board. Thus, the possibility of the busbar and the wire being caused to rub against each other by vibration can be minimized in the regions where the coated portion of the wire breaks most easily, and a short circuit due to breakage of the coated portion can be avoided securely.

In the case where the busbar is wide, notches or holes may be formed in predetermined portions of the busbar corresponding to the laid wire. In this case, pressure ribs are formed at narrow spaces on predetermined portions of the insulating plate 15 and the lower casing 11 so that the wire W can be pressed by means of the ribs. Thus, even with use of the wide busbar, the wire W can be securely kept apart from the whole busbar with respect to its width direction, so that breakage of the coated portion of the wire can be prevented more effectively.

Further, the wire W, unlike the one according to the embodiment described above, need not always be laid on either side of the wiring board 13, and may be laid only on one side of the board 13. In this case, it is necessary only that pressure ribs be formed correspondingly.

Moreover, the pressure ribs need not always be formed corresponding to the whole laying groove except its portions that are touched by the busbar. Thus, only if pressure ribs are formed at least corresponding to the laying groove near the edges of the busbar, the wire W can be effectively prevented from interfering with the edges of the busbar that can break the coated portion of the wire most easily.

Furthermore, the electrical connection box need not always be provided with the insulating plate 15 according to the embodiment described above. If the box is not provided with the insulating plate 15, pressure ribs may be formed on the upper casing and/or the lower casing. In attaching the upper and lower casings to the wiring board by means of the busbar in this case, the wire W on the board can be kept apart from the whole area of the busbar in its width direction.

An electrical connection box according to another embodiment of the present invention will now be described with reference to the accompanying drawings.

Figure 6:
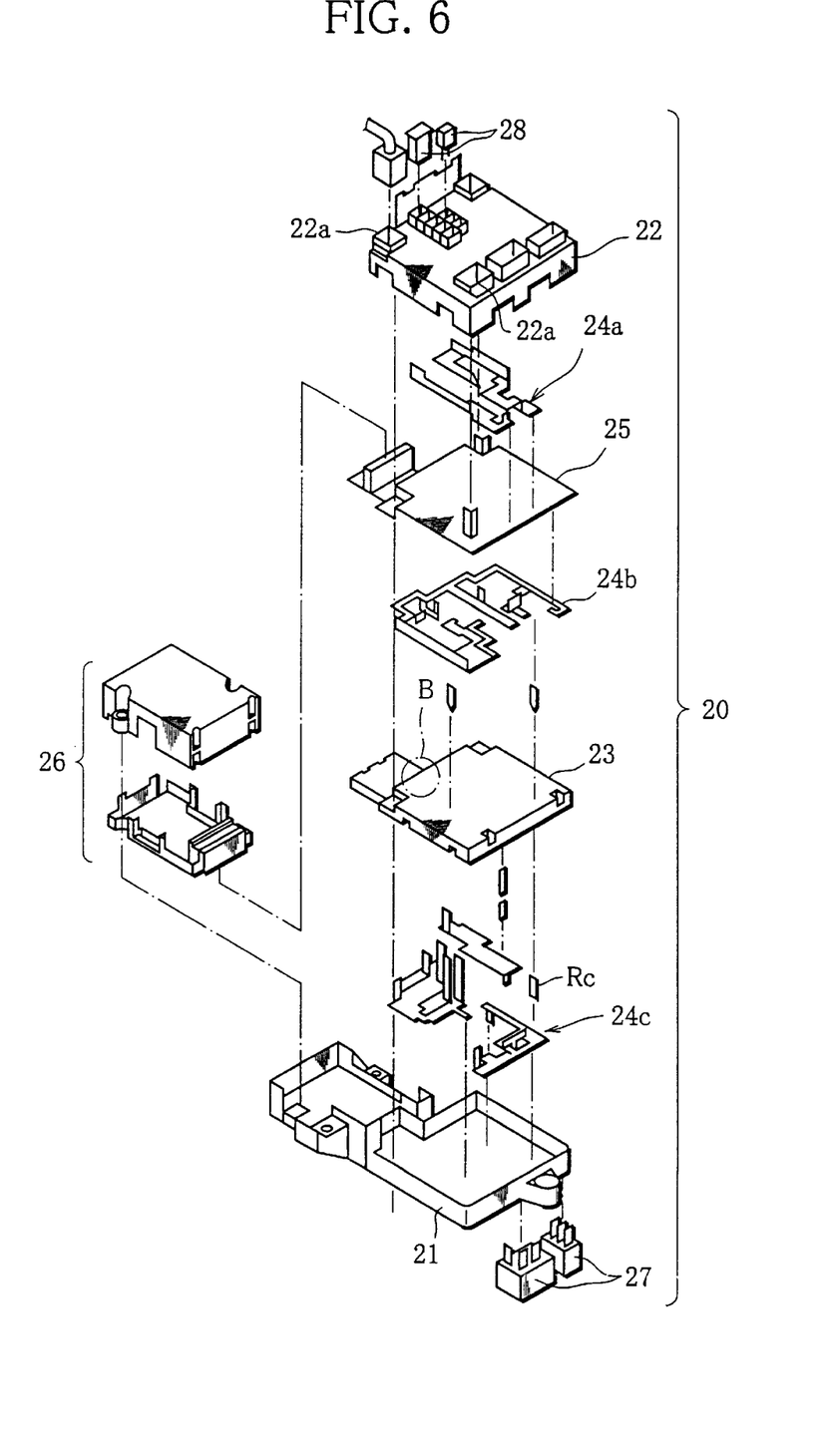
FIG. 6 is an exploded perspective view of an electrical connection box 20 according to another embodiment of the invention.

As shown in FIG. 6, an electrical connection box 20 according to the second embodiment of the invention comprises a lower casing 21 fitted with relays 27, an upper casing 22 fitted with fuses 28 and formed with external connecting terminals 22a for connection with a wire harness, and an electrically insulating wiring board 23 located between the lower and upper casings 21 and 22 and having a wire W (shown in FIGS. 7 and 8) for low-current conduction thereon. The electrical connection box 20 further comprises busbars 24a, 24b and 24c interposed between the wiring board 23 and the upper casing 22 and between the wiring board 23 and the lower casing 21 and serving to conduct high current, an insulating plate 25 put on the wiring board 23, an electronic unit 26 attached to the lower casing 21, etc.

Figure 7:
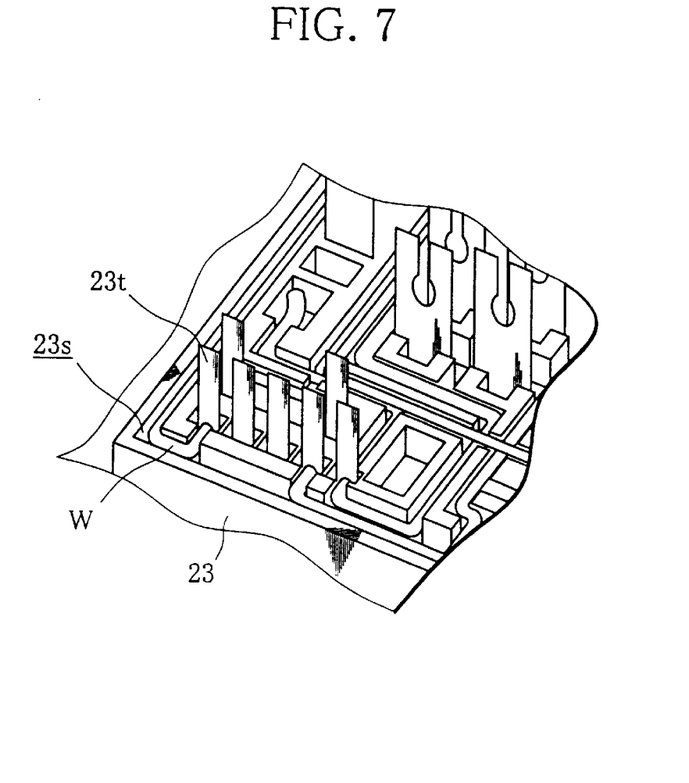
FIG. 7 is a detailed perspective view showing a part (portion B in FIG. 6) of a wiring board 23 of the electrical connection box 20 shown in FIG. 6.
Figure 8:
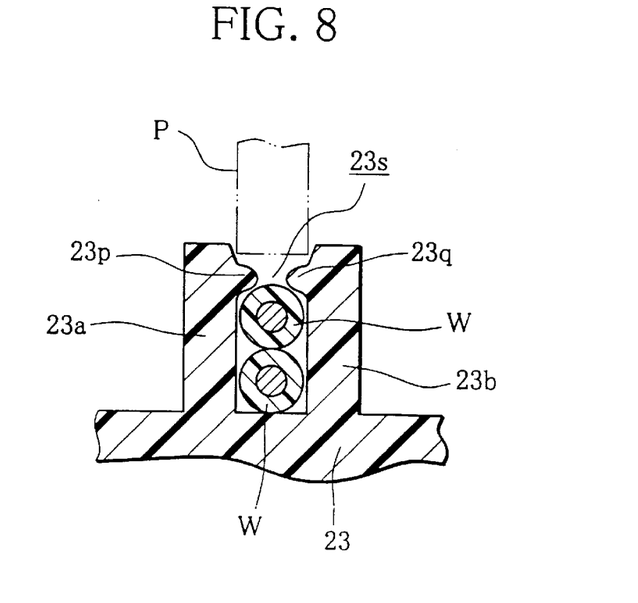
FIG. 8 is a sectional view partially showing the wiring board 23 having ribs 23a and 23b with wire retaining protuberances 23p and 23q thereon.

The wiring board 23 is formed of an easily moldable resin material, such as polypropylene. As shown in FIGS. 7 and 8, laying grooves 23s (described in detail later) are formed extending lengthwise and crosswise on the upper and lower surfaces of the wiring board 23, individually. As is partially shown in FIG. 7, the wire W is arranged with one stroke along a predetermined path of each laying groove 23s. In order to form a plurality of independent circuits, the wire W is cut at given spots, and a plurality of pressure welded terminals 23t are driven in given positions on the wire W. As shown in FIG. 6, the terminals 23t are connected electrically to electrical components, such as the relays 27, fuses 28, external connecting terminals 22a, etc., through a receptacle Rc.

On the other hand, the busbars 24a, 24b and 24c serve to form a circuit for high-current conduction. They are obtained by stamping out and bending an electrically conductive metal plate. The busbar 24b is mounted between one laying surface of the wiring board 23 and one side of the insulating plate 25, while the busbar 24a is attached to the other side of the plate 25. The busbars 24c are attached to the other laying surface of the wiring board 23. The insulating plate 25 is formed having insulating protrusions (not shown) in given positions on its surface that faces the wiring board 23. The insulating protrusions are fitted individually in the cut portions of the wire W that is laid on the wiring board 23, whereby insulation between the circuits formed by the wire W is secured.

The wiring board 23 is formed having ribs 23a and 23b that extend lengthwise and crosswise, as shown in FIG. 7, and are opposed to each other with a given space between them, as shown in FIG. 8. The space between the ribs 23a and 23b is substantially equal to the diameter of the wire W. The ribs 23a and 23b are just high enough to hold the wire W in two or three tiers between them. The continuously opposed ribs 23a and 23b form each laying groove 23s. The wire W is continuously led out from a wire supply nozzle (not shown) of an automatic laying apparatus into the laying groove 23s, and is laid in the predetermined path in the aforesaid manner. Since the wire W is continuously laid with one stroke, it is doubled in some specific portions of the laying groove 23s, as shown in FIG. 8. Protuberances 23p and 23q for preventing the wire W from slipping out of the laying groove 23s are formed on predetermined portions of the ribs 23a and 23b, respectively, especially in the position where the doubled wire W is held. The protuberances 23p and 23q protrude from the respective upper parts of the inner walls of the ribs 23a and 23b, respectively, so as to approach each other. The protuberances 23p and 23q are expected to be only high enough to prevent the wire W from slipping out of the laying groove 23s.

As shown in FIG. 8, the protuberances 23p and 23q are formed by using a platelike pressing jig P of iron or any other material that is harder than the resin material of the ribs 23a and 23b. More specifically, the pressing jig P is pressed against the respective top surfaces of the ribs 23a and 23b (in the direction of arrow D of FIG. 9) from above the laying groove 23s after the laying operation, whereupon the ribs 23a and 23b are deformed so that they partially project inward or toward each other, as shown in FIG. 8.

Figure 9:
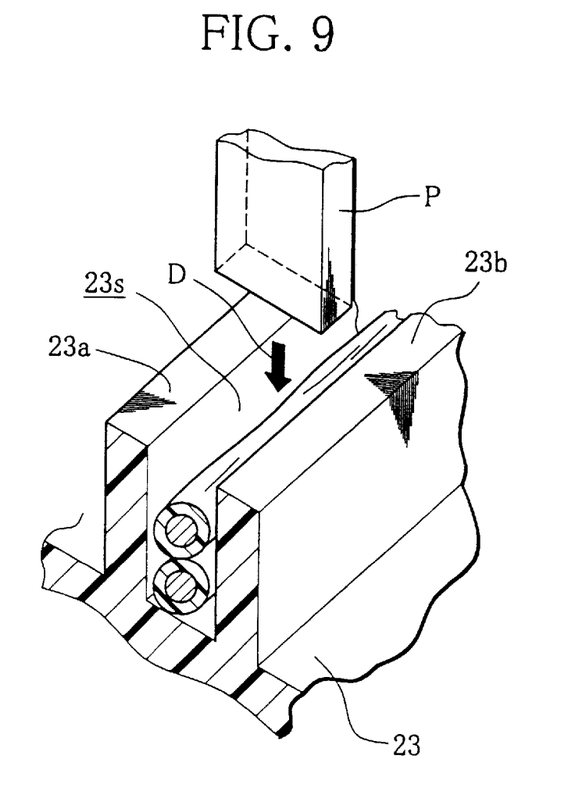
FIG. 9 is a partial perspective view of the wiring board 23, partially in section, illustrating a method for forming the wire retaining protuberances 23p and 23q in a laying groove 23s.

This post-process involving the deformation can be carried out easily by means of the pressing jig P of a material that is harder than polypropylene. By pressing the jig P against the laying groove 23s at given spaces, the protuberances 23p and 23q for retaining the wire can be formed in given positions in the laying groove 23s at given spaces. In each spot where the wire W is doubled as it is laid, in particular, the upper line of the wire W, which is liable to project from the laying groove 23s, can be effectively prevented from projecting from the groove 23s by means of the protuberances 23p and 23q formed in this manner. Since the respective inner walls of the ribs 23a and 23b are not previously formed with any projections, such as the wire holding projections 3p and 3q of the conventional laying groove 3s, the wire W can be laid without resistance.

After the laying operation and the formation of the protuberances 23p and 23q are finished in this manner, the conventional wire cutting operation and the attachment of the busbars 24a, 24b and 24c, lower casing 21, upper casing 22, etc. are carried out, whereupon the electrical connection box 20 is completed.

Since the laying groove 23s of the wiring board 23 of the electrical connection box 20 assembled in this manner is formed with the protuberances 23p and 23q that are arranged at given spaces, the wire W can be held securely without the possibility of slipping out of the laying groove 23s. Even when the electrical connection box 20 is mounted in a vehicle and subjected to vibration, therefore, there is no possibility of the wire W interfering with any busbar and causing a short circuit.

Alternatively, the aforesaid wire retaining protuberances may be formed over the conventional wire holding projections of FIG. 14 or in any other positions by means of the pressing jig. In this case, the wire W may be laid with the holding projections left on the inner wall of the laying groove.

According to this alternative arrangement, the wire holding projections are left in the laying groove, so that they provide some resistance when the wire is laid in the groove. After the laying operation, however, the wire can be held in the laying groove by means of both the holding projections and the retaining protuberances, so that it can be more accurately prevented from slipping out of the groove.

Further, the pressing jig may be heated by means of a heater therein as it is pressed against the ribs.

According to this arrangement, the ribs can be deformed more quickly by means of heat from the heater as well as pressure. If the ribs are formed of polypropylene or any other thermoplastic resin, the wire retaining protuberances can be formed more efficiently.

Figure 10:
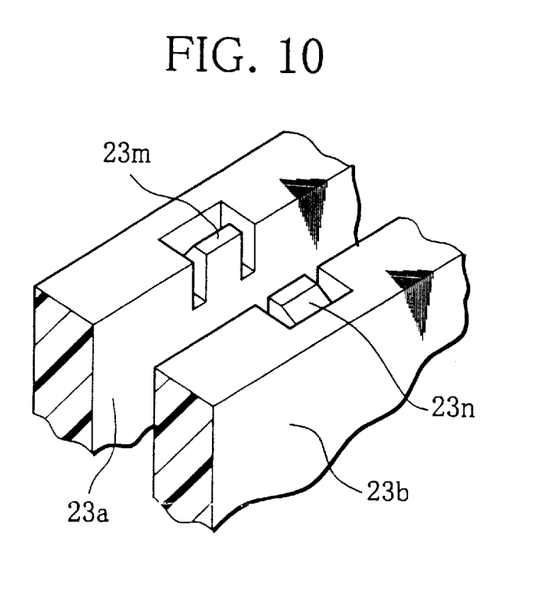
FIG. 10 is a partial perspective view, partially in section, showing clicks 23m and 23n on the ribs 23a and 23b according to a modification of the embodiment shown in FIG. 8.
Figure 11:
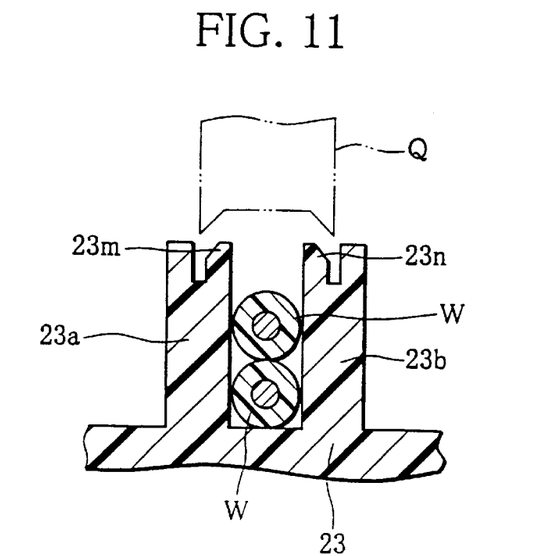
FIG. 11 is a partial sectional view for illustrating a method for forming wire retaining protuberances on the ribs 23a and 23b shown in FIG. 10.

Moreover, the wire retaining protuberances may be formed in a manner such that notches are previously cut in the respective upper parts of the ribs 23a and 23b, as shown in FIGS. 10 and 11, and a pressing jig Q is pressed against clicks 23m and 23n that are formed in their corresponding notches. Thus, the protuberances can be formed more easily.

Furthermore, the laying groove need not always be formed of ribs that are opposed to each other with a given space between them, and may be a groove that is formed directly in the wiring board. Even in this case, the wire retaining protuberances can be post-formed after the laying operation by collapsing the groove from above by means of the pressing jig.

The location of the wire retaining protuberances is not limited to the spots where the wire is laid doubly or trebly in the laying groove, and the protuberances may be formed in any other suitable places in the groove.

Although the specific embodiments of the present invention have been shown and described herein, it is to be understood that the invention is not limited to the embodiments described above, and that various changes and modifications may be effected therein by one skilled in the art without departing from the scope or spirit of the invention.

What is claimed is:

1. An electrical connection box for carrying electrical components, comprising:

first and second casings capable of being combined with each other;

an electrically insulating wiring board located between the first and second casings and having a wire laid in a desired shape thereon;

a busbar in contact with a predetermined portion of a surface of the wiring board; and an insulating plate located between at least one of: (i) the first casing and the wiring board, (ii) the second casing and the wiring board, wherein the insulating plate comprises a projection that presses the wire away from the busbar.

2. The electrical connection box according to claim 1, wherein the wiring board comprises a laying groove in which the wire is laid.

3. The electrical connection box according to claim 1, wherein said busbar comprises at least one of a notch and a hole in a predetermined portion thereof, and said projection is formed on a portion of the insulating plate which corresponds to the at least one of the notch and the hole.

4. An electrical connection box for carrying electrical components, comprising:

first and second casings capable of being combined with each other;

an electrically insulating wiring board located between the first and second casings and having a wire laid in a desired shape thereon; and a busbar in contact with a predetermined portion of a surface of the wiring board, wherein at least one of the first casing and the second casing comprises, on a surface thereof which is in contact with the surface of the wiring board, a projection that presses the laid wire away from the busbar.

5. The electrical connection box according to claim 4, wherein the wiring board comprises a laying groove in which the wire is laid.

6. The electrical connection box according to claim 4, wherein said busbar comprises at least one of a notch and a hole in a predetermined portion thereof, and said projection is formed on a portion of the at least one of the first casing and the second casing which corresponds to the at least one of the notch and the hole.

* * * * *